(12) United States Patent
Mohondro et al.

(10) Patent No.: US 6,406,836 B1
(45) Date of Patent: Jun. 18, 2002

(54) METHOD OF STRIPPING PHOTORESIST USING RE-COATING MATERIAL

(75) Inventors: Robert Mohondro, Sykesville; Qingyuan Han, Columbia; Ivan Berry, Ellicott City, all of MD (US); Mahmoud Dahimene, Sunnyvale, CA (US); Stuart Rounds, Frederick, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/531,885

(22) Filed: Mar. 21, 2000

Related U.S. Application Data

(60) Provisional application No. 60/125,616, filed on Mar. 22, 1999.

(51) Int. Cl.⁷ .................................................. G03F 7/36
(52) U.S. Cl. ....................... 430/329; 430/311; 430/313; 430/314; 438/706; 216/67
(58) Field of Search ................................ 430/311, 313, 430/314, 329; 438/706; 216/67

(56) References Cited

U.S. PATENT DOCUMENTS 6,251,794 B1 * 6/2001 Peng et al. ................. 438/712

FOREIGN PATENT DOCUMENTS

| JP | 1-100946 | * 4/1989 |
| JP | 8-293490 | * 11/1996 |

* cited by examiner

*Primary Examiner*—Mark F. Huff
*Assistant Examiner*—Nicole Barreca

(57) ABSTRACT

A method of stripping a photoresist layer comprising applying a re-coating material on the photoresist layer which extends through and fills openings in a first layer on which the photoresist layer is disposed, ashing the stack comprised of the photoresist layer and the re-coating material, and removing such re-coating material as remains in the openings in the first layer after the ashing.

4 Claims, 3 Drawing Sheets

METHOD OF STRIPPING PHOTORESIST USING RE-COATING MATERIAL

This application is based on Provisional Application No. 60/125,616, filed Mar. 22, 1999.

FIELD OF THE INVENTION

The invention relates to the manufacture of integrated circuits, and is directed to a method of improving photoresist ash selectivity. It has particular applicability where a dielectric layer is prone to attack by the ashing process.

BACKGROUND OF THE INVENTION

In the manufacture of integrated circuits, the technique of photolithography may be required to form circuit patterns. In the practice of this technique, a semiconductor wafer structure is coated with a photoresist. The photoresist is then exposed to ultraviolet radiation which is passed through a patterned template or a mask so that a desired pattern is imaged on the photoresist. This causes changes in the solubility of the exposed areas of the photoresist such that after development in a suitable developer a desired pattern is fixed on the wafer structure. Etching of the pattern in the wafer structure may then occur, and deposits may be made in the etched away areas. After etching or subsequent steps, it is necessary to strip the photoresist from the wafer as it has already served its useful purpose and remove the etch deposits.

In a process as described above, a photoresist layer is coated onto a first layer. The first layer is disposed on a second layer. After UV exposure and development of the photoresist, the photoresist and first layer are etched to produce openings in the first layer which expose the second layer.

An example of such a process to which the present invention is particularly applicable is where the second layer is a dielectric which is prone to attack by the ashing process. In such a situation, it may be necessary to use a protective layer (the first layer) between the dielectric layer and the photoresist. However, even with such a protective layer, after etching of the photoresist and the protective layer is effected to produce openings, the dielectric layer will be exposed through such openings. During ashing, the exposed areas of the dielectric layer may be attacked to create a region of undercut in the dielectric layer. This is undesirable, since small deviations in the etched profiles can adversely affect the performance, yield and reliability of the final integrated circuit.

A process to which the invention may be advantageously applied is where the dielectric layer is made of a low dielectric constant material (low-k). New low-k materials are presently being investigated for their potential use as insulators in semiconductor chip fabrication in conjunction with copper to form high speed/low capacitance interconnections within the semiconductor chip. The two materials are integrated in a Damascene (or dual-Damascene) structure where copper is deposited in etched patterns within the low-k material to form an embedded-dielectric architecture.

In one embodiment of this process, a hard mask is present between the low-k dielectric layer and the photoresist. After the photoresist is exposed and developed, it and the hard mask are etched, after which the photoresist layer may be stripped. Since most of the low-k materials presently being investigated are organic polymers or inorganic materials with weak bonds, they are prone to unwanted attack by conventional oxygen based dry clean processes. Typically the organic low-k materials are removed at roughly the same rate as photoresist, making the ash selectivity of photoresist to low-k materials close to unity (selectivity is defined as the rate of removal ratio between the two materials). As discussed above, this can cause a problem in that undercutting of the dielectric material may occur. The inorganic materials while not substantially etched are typically damaged by the plasma to the point that their dielectric constant increases to above 3.0.

SUMMARY OF THE INVENTION

In accordance with the present invention, an improved method of stripping a photoresist layer is provided wherein the photoresist is coated on a first layer except where there are openings in the first layer which expose a second layer, which comprises the steps of, applying a re-coating material on the photoresist layer having ash characteristics similar to the material of the photoresist layer, which re-coating material extends through and fills the openings in the first layer, ashing the stack comprised of the photoresist layer and re-coating material, and removing such re-coating material as remains in the openings in the first layer after the ashing.

BRIEF DESCRIPTION OF THE DRAWINGS

The invention will be better appreciated by referring to the accompanying drawings wherein.

DETAILED DESCRIPTION OF THE INVENTION

Figure 1:
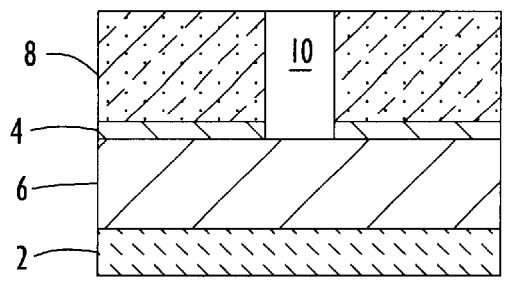
FIG. 1 shows a wafer structure after the photoresist and first layer have been etched.

Referring to FIG. 1, a semiconductor wafer structure which has undergone an etching step is shown. Semiconductor substrate 2 has first and second layers 4 and 6 thereon. A photoresist layer is coated on first layer 4. The photoresist layer 8 and first layer 4 have an opening 10 in them, which is the result of etching.

Figure 2:
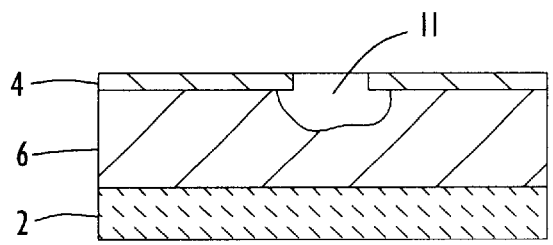
FIG. 2 shows an undercut which may appear with the conventional process.

After the etch step, it is necessary to remove the photoresist layer by an ashing step. However, doing so may cause an undercut in the second layer 6 in the region of opening 10. Such an undercut is shown in FIG. 2, where it is identified by reference numeral 11. The invention is particularly applicable to such systems where the second layer 6 is prone to attack by the ashing process (plasma sensitive). One such system is where the second layer 6 is a low-k dielectric layer and the first layer 4 is a protective layer such as a hard mask.

As mentioned above, most of the low-k dielectrics which are presently of interest are organic polymers or inorganic materials which are more prone to attack by ashing processes then the SiO2 which has conventionally been used for a dielectric. The invention will hereinafter be described in reference to the case where the second layer discussed above is an organic low-k dielectric layer.

Figure 3:
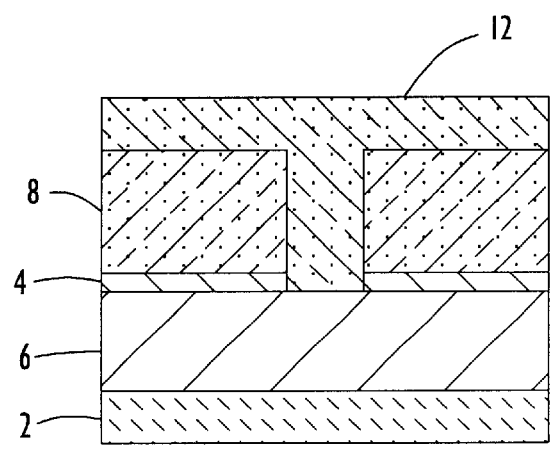
FIG. 3 shows the wafer structure with re-coating material.

FIG. 3 depicts the first step of the present invention, where an organic polymeric material 12 is applied to the cap-open wafer (e.g. spun on), filling up the openings such as holes and trenches in the photoresist and hard mask which are generated during cap-open etching processes and adding a thin layer onto the photoresist. The re-coating material 12 acts as a protective layer covering the low-k material and thus preventing exposure of the low-k layer to the plasma gas during the resist stripping process.

It is advantageous for the materials used for the re-coating material to have ash characteristics which are similar or somewhat more robust than the photoresist to be removed, i.e., the re-coating material should ash at about the same rate as the photoresist so that both photoresist and re-coating material may be uniformly removed.

By way of non-limitative example, the re-coating material may be the same as the photoresist material, or if the photoresist is hardened during the etching process, the re-coating material may be of a hardness which corresponds to the hardened photoresist.

After the re-coating material is applied, the wafer is processed in an asher, so as to strip off both the photoresist and re-coating material. By way of example, a downstream plasma asher may be used with a predominant oxygen chemistry. OES (oxygen emission spectroscopy) can be used as an endpoint for the complete removal of the photoresist stack (the photoresist, and that part of the re-coating material which is above the level of the hard mask).

Figure 4:
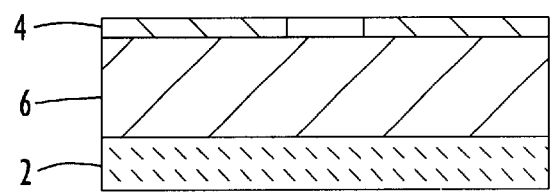
FIG. 4 shows the wafer structure of FIG. 3 after ashing and overash have been performed.

The ashing step is followed by an overash step, which can be controlled more precisely than the ashing step because only the much smaller amount of material which remains after the ashing step needs to be removed. This material is comprised of residue, and the re-coating material which remains in the openings in the hard mask. The result of the overash step is depicted in FIG. 4, where it will be noted that all of the polymeric hole filling material is removed from the opening in the hard mask. All of this is accomplished without any undercut in the dielectric layer.

Figure 5:
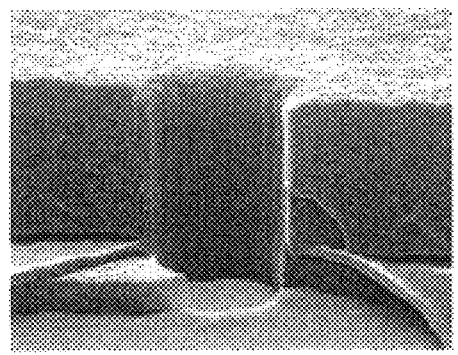
FIG. 5 is an SEM picture which corresponds to FIG. 1.
Figure 6:
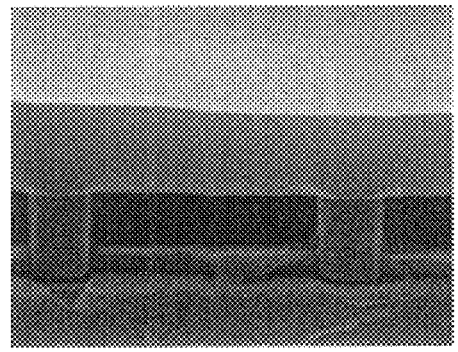
FIG. 6 is an SEM picture which corresponds to FIG. 3.
Figure 7:
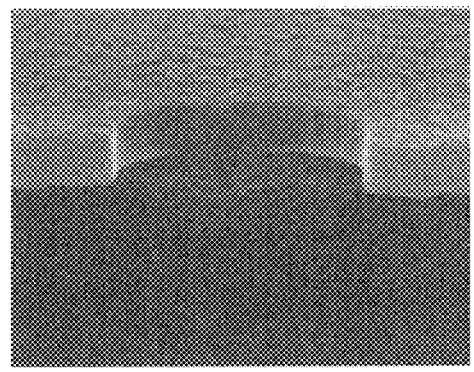
FIG. 7 is an SEM picture which corresponds to FIG. 4.
Figure 8:
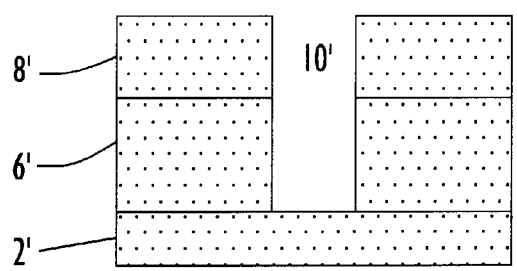
FIG. 8 shows a different wafer structure than FIG. 1, after the photoresist and first layer have been etched.

FIGS. 5 to 7 are SEM (scanning electron microscope) pictures showing a cross-section of the cap-open wafer undergoing the process of the invention. FIG. 5 shows the wafer post cap-open etch with photoresist remaining on top of the hard mask. FIG. 6 shows the wafer after re-coating, with the holes and trenches filled up with re-coating material, while FIG. 7 shows the wafer after the stripping process with the hole filling material removed without any undercut.

Figure 9:
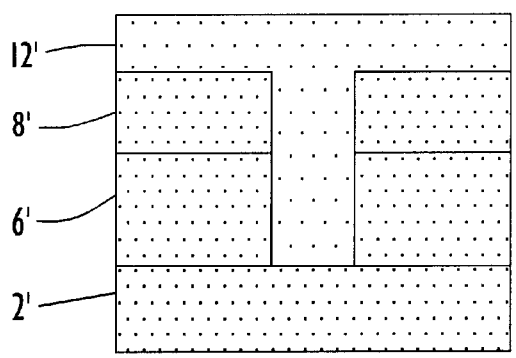
FIG. 9 shows the wafer structure of FIG. 8 with the re-coating material.
Figure 10:
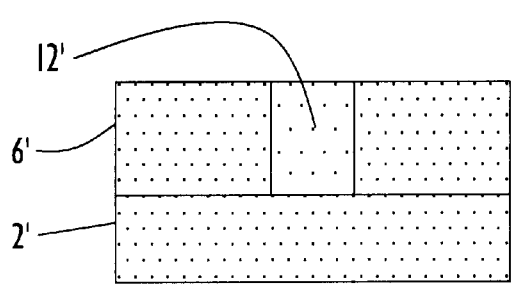
FIG. 10 shows the wafer structure after ashing of the stack.
Figure 11:
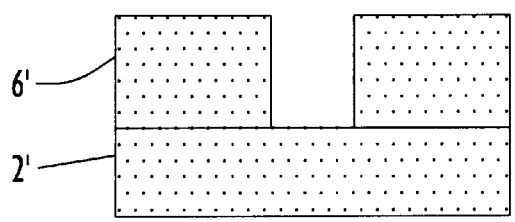
FIG. 11 shows the wafer structure after material remaining after ashing has been removed.

A second embodiment is depicted in FIGS. 8 to 11, wherein like elements are identified with "primed" numerals. In the second embodiment, the plasma sensitive material 6' is in contact with the photoresist 8' as depicted in the Figures. The overcoat 12' now fills the holes etched into the plasma sensitive material as shown in FIG. 9. In this embodiment, the stack of the re-coating material 12' and the photoresist 8' are ashed, (i.e. stripped down to the plasma sensitive material, as shown in FIG. 10). The re-coating material is then removed from the holes in the plasma sensitive material by some non-plasma means, such as a high purity water rinse, with the result as shown in FIG. 11. For example, the re-coating material in this embodiment may be poly vinyl alcohol, which is a water soluble polymer.

The invention may be utilized with many different types of materials. By way of non-limitative example, the low-k dielectric may be Silk™, FLARE™, (as examples of organic low-k materials) or Coral™, Black Diamond™, and HOSP™ (as examples of inorganic low-k materials. These typically have a dielectric constant of between about 2 and 2.8, as compared to a dielectric constant of about 4 for the $SiO_2$. Any type of photoresist may be used, for example, I-line or deep UV, and the hard mask may be made of $SiO_2$ or SiN4.

In actual processes which were performed in accordance with the invention a BCB, Flare™ and Silk™ low-k dielectric were used with an $SiO_2$ or $Si_3N_4$ hard mask and a PHS based or positive Novolac based photoresist. The re-coated material was TDUR type resist by Tokyo Ohka softbaked at 120° C., and the stack was ashed in an Eaton FSD GeminiEs asher using a predominant oxygen chemistry for 50–70 seconds. After main ashing, an over-ash step was performed for 15 seconds to completely remove the re-coating material from the openings in the hard mask. The wafers were then rinsed in de-ionized water.

The invention thus provides a photoresist stripping process having improved selectivity. The invention may be used with other types of plasma sensitive materials besides low-k dielectric. While the invention has been described in connection with preferred and illustrative embodiments, variations which fall within the spirit and scope of the invention may occur to those skilled in the art. Thus, the invention to be covered is defined by the following claims.

What is claimed is:

1. A method of stripping a photoresist layer, wherein the photoresist layer is coated on a first layer except where there are openings in the first layer which expose a second layer, comprising the steps of:

applying a re-coating material on the photoresist layer having ash characteristics similar to the material of the photoresist layer, which re-coating material extends through and fills the openings in the first layer, ashing a stack comprised of the photoresist layer and re-coating material, and removing such re-coating material as remains in the openings in the first layer after the ashing by a water rinse.

2. A method of stripping a photoresist layer, wherein the photoresist layer is coated on a first layer except where there are openings in the first layer which expose a second layer, comprising the steps of:

applying a re-coating material on the photoresist layer having ash characteristics similar to the material of the photoresist layer, which re-coating material extends through and fills the openings in the first layer, ashing a stack comprised of the photoresist layer and re-coating material, and removing such re-coating material as remains in the openings in the first layer after the ashing, wherein the first layer is a protective layer and the second layer is a low-k dielectric layer.

3. A method of stripping a photoresist layer, wherein the photoresist layer is coated on a first layer except where there are openings in the first layer which expose a second layer, comprising the steps of:

applying a re-coating material on the photoresist layer having ash characteristics similar to the material of the photoresist layer, which re-coating material extends through and fills the openings in the first layer, ashing a stack comprised of the photoresist layer and re-coating material, and removing such re-coating material as remains in the openings in the first layer after the ashing by overashing, wherein the second layer is a low-k dielectric layer.

4. A method for the manufacture of semiconductor devices, comprising the steps of:

providing a structure comprised of first and second layers, applying photoresist to the first layer, exposing the photoresist through a patterned template to ultraviolet light, developing the photoresist to create a pattern which corresponds to the patterned template etching the photoresist and first layer, and stripping the photoresist, wherein the stripping comprises:

i) applying a recoating material on the photoresist having ash characteristics similar to the material of the photoresist, which extends through and fills the openings in the photoresist and first layer, ii) ashing a stack comprised of the photoresist and re-coating material, and iii) removing such re-coating material as remains in the openings in the first layer after the ashing by overashing, wherein the second layer is a low-k dielectric layer and the first layer is a hard mask.

* * * * *